US008833965B2

(12) United States Patent
Shimasaki et al.

(10) Patent No.: US 8,833,965 B2
(45) Date of Patent: Sep. 16, 2014

(54) LIGHT-EMITTING CIRCUIT, LUMINAIRE, AND MANUFACTURING METHOD FOR THE LIGHT-EMITTING CIRCUIT

(75) Inventors: Susumu Shimasaki, Kanagawa-ken (JP); Takashi Oku, Kanagawa-ken (JP); Junichi Ishiguro, Kanagawa-ken (JP); Kenichi Asami, Kanagawa-ken (JP); Takashi Inoue, Kanagawa-ken (JP)

(73) Assignee: Toshiba Lighting & Technology Corporation, Yokosuka-shi, Kanagawa-ken (JP)

( * ) Notice: Subject to any disclaimer, the term of this patent is extended or adjusted under 35 U.S.C. 154(b) by 86 days.

(21) Appl. No.: 13/609,952

(22) Filed: Sep. 11, 2012

(65) Prior Publication Data
US 2013/0193457 A1 Aug. 1, 2013

(30) Foreign Application Priority Data

Jan. 26, 2012 (JP) .................................. 2012-014030
Jan. 26, 2012 (JP) .................................. 2012-014032

(51) Int. Cl.
*F21S 4/00* (2006.01)
*F21S 2/00* (2006.01)

(52) U.S. Cl.
CPC ...................................... *F21S 2/005* (2013.01)
USPC ...................................... 362/219; 362/249.02

(58) Field of Classification Search
USPC ................... 362/219, 217.01, 249.02
See application file for complete search history.

(56) References Cited

U.S. PATENT DOCUMENTS

| 6,730,933 | B1 * | 5/2004 | Shimizu et al. ................. 257/79 |
| 2008/0025022 | A1 * | 1/2008 | Schinzel et al. ............. 362/249 |
| 2009/0323334 | A1 * | 12/2009 | Roberts et al. ................ 362/247 |
| 2011/0194284 | A1 * | 8/2011 | Quaal et al. ............. 362/249.02 |

FOREIGN PATENT DOCUMENTS

| JP | 2008-098560 | 4/2008 |
| JP | 2010-161046 | 7/2010 |
| JP | 2010-177172 | 8/2010 |

OTHER PUBLICATIONS

Extended EP Searh Report mailed May 31, 2013, EP Appln. 12183095.4-1757.

* cited by examiner

*Primary Examiner* — Ali Alavi
(74) *Attorney, Agent, or Firm* — Banner & Witcoff, Ltd.

(57) ABSTRACT

According to one embodiment, a light-emitting circuit includes: a plurality of substrates in which wiring pattern layers are formed, the substrates including light-emitting elements connected to and mounted on the wiring pattern layers; and a linear conductor having electric conductivity, the linear conductor including linear joining sections at both ends electrically connected to the wiring pattern layers of the substrates and a convex section formed to be bent in a convex shape in an intermediate section between the joining sections, and the joining sections being respectively joined to the wiring pattern layers among the plurality of substrates adjacent to one another.

8 Claims, 18 Drawing Sheets

LIGHT-EMITTING CIRCUIT, LUMINAIRE, AND MANUFACTURING METHOD FOR THE LIGHT-EMITTING CIRCUIT

CROSS-REFERENCE TO RELATED APPLICATION

The application is based upon and claims the benefit of priority from Japanese Patent Application No. P2012-14030, filed on Jan. 26, 2012; the entire contents of which are incorporated herein by references. Further, the application is based upon and claims the benefit of priority from Japanese Patent Application No. P2012-14032, filed on Jan. 26, 2012; the entire contents of which are incorporated herein by references.

FIELD

Embodiments described herein relate generally to a light-emitting circuit, a luminaire, and a manufacturing method for the light-emitting circuit.

BACKGROUND

In recent years, according to an increase in output and improvement of efficiency of an LED (light-emitting diode), a luminaire including the LED as a light source and used indoor or outdoor is developed. Low power consumption and long life of the luminaire can be expected. In the luminaire, for example, substrates mounted with LEDs are disposed side by side. The substrates are electrically connected by connectors or the like to obtain predetermined brightness using light emitted from the LEDs.

However, if the substrates are connected by the connectors, it is difficult to efficiently perform work for connecting the substrates. Further, the work is not advantageous in terms of costs. Therefore, for example, there is proposed a method of soldering jumper wires, which are formed by bending a metal plate, to electrically connect substrates. The above mentioned technology is disclosed in Japanese Patent Application Laid-Open No. 2010-177172 and Japanese Patent Application Laid-Open No. 2008-98560, contents of which are hereby incorporated by reference.

In the luminaire of this type, if the substrates are connected by the connectors, the connectors are likely to be obstacles to block the light emitted from the LEDs. Further, it is difficult to efficiently perform work for connecting the substrates. The work is not advantageous in terms of costs. Therefore, for example, there is proposed a method of soldering the substrates using lead wires to join the substrates and electrically connecting the substrates. The above mentioned technology is disclosed in Japanese Patent Application Laid-Open No. 2010-161046 and Japanese Patent Application Laid-Open No. 2010-177172, contents of which are hereby incorporated by reference.

DETAILED DESCRIPTION

Figure 1:
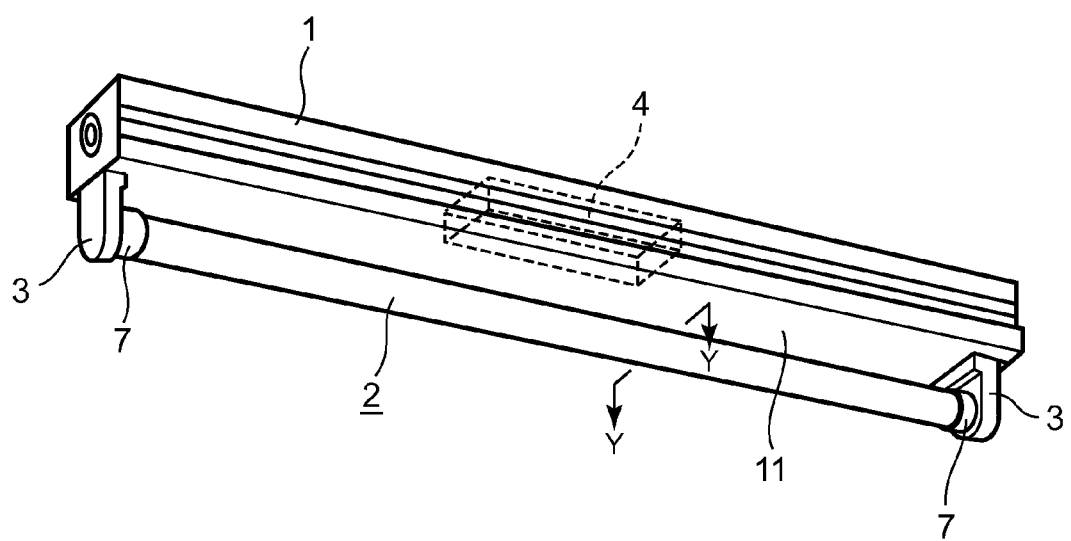
FIG. 1 is a perspective view of a luminaire according to a first embodiment.

In a luminaire in the past, when substrates are attached to a main body side, places of the substrates are fixed to the main body side using screws or the like. On the other hand, heat is generated during the use of an LED. The substrates are heated and cooled when the LED is turned on and off. The substrates repeat expansion and contraction in a heat cycle of the heating and the cooling and receive stress. The stress not only acts in the longitudinal direction of the substrates but also acts in a torsion direction. Further, the stress sometimes acts in a direction in which the substrates laterally shift from each other because of vibration or the like. The stress acts in various directions. Therefore, it is likely that, for example, deflection, deformation, and a gap occur in the substrates, a load is applied to a soldered portion (a joined portion) and a crack occurs, and the substrates are disconnected. Therefore, if the substrates are connected using a jumper wire formed by bending a metal plate, the stress acting in the longitudinal direction of the substrates can be absorbed to some degree. However, in the torsion direction and the lateral shift direction, the stress may not be able to be sufficiently absorbed because of the rigidity of the metal plate. It is difficult to reduce the load applied to the soldered portion. When soldering is performed, it is difficult to automate a process for soldering the jumper wire formed by bending the metal plate. Therefore, the jumper wire is not suitable for mass production.

In general, according to one embodiment, a linear conductor is a linear member having electric conductivity. The linear conductor includes linear joining sections at both ends electrically connected to a wiring pattern layer of a substrate and a convex section formed to be bent in a convex shape in an intermediate section between the joining sections.

According to this embodiment, it is possible to provide a linear conductor that can reduce a load applied to a joined portion and is suitable for automation of a joining process, a light-emitting circuit and a luminaire in which the linear conductor is used, and a manufacturing method for the light-emitting circuit.

Further, in the case of the luminaire in the past, it is not taken into account to secure joining strength in the joining of the lead wire. Therefore, it is difficult to guarantee the reliability of the joining of the lead wire.

In general, according to another embodiment, a light-emitting circuit includes a plurality of substrates on which light-emitting elements are mounted and solder land sections are formed and a lead wire joined by soldering to the solder land sections over the plurality of substrates adjacent to one another and configured to electrically connect the substrates. The wire diameter dimension of the lead wire is 0.4 mm to 0.6 mm. The area of the solder land sections is 4 $mm^2$ to 8 $mm^2$.

According to the other embodiment, it is possible to provide a light-emitting circuit and a luminaire that can secure joining strength in the joining of the lead wire and secure reliability of the joining.

Figure 2:
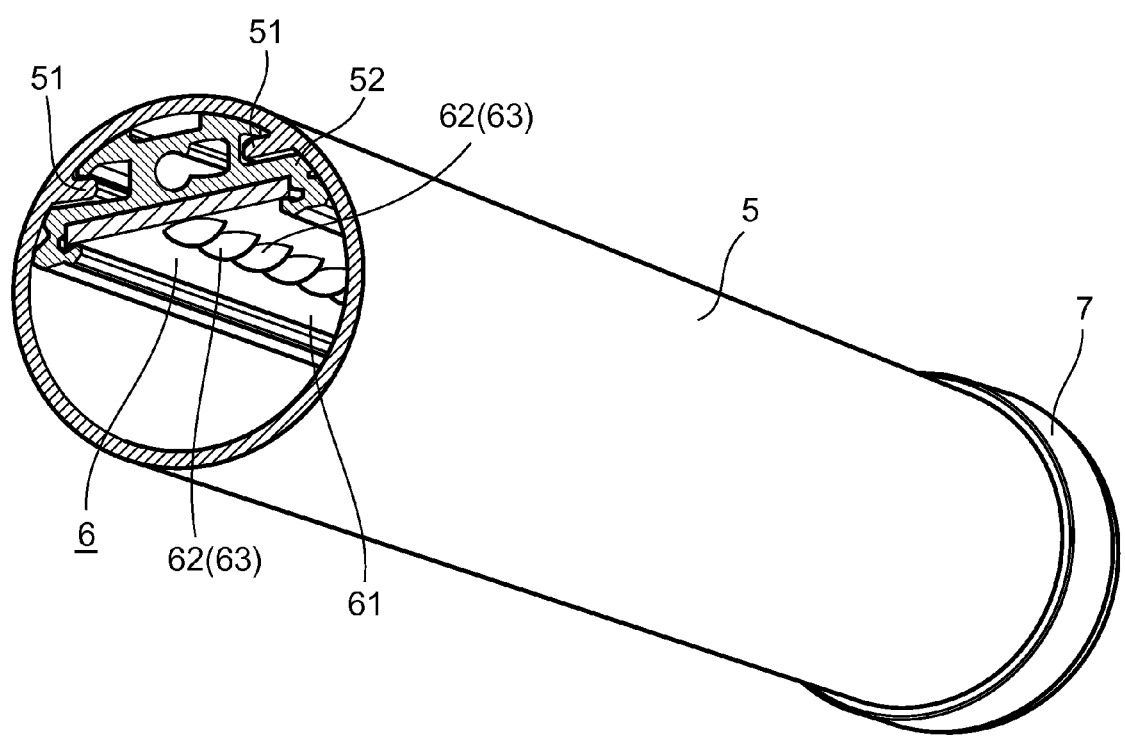
FIG. 2 is a perspective view of the luminaire taken along line Y-Y shown in FIG. 1.
Figure 5:
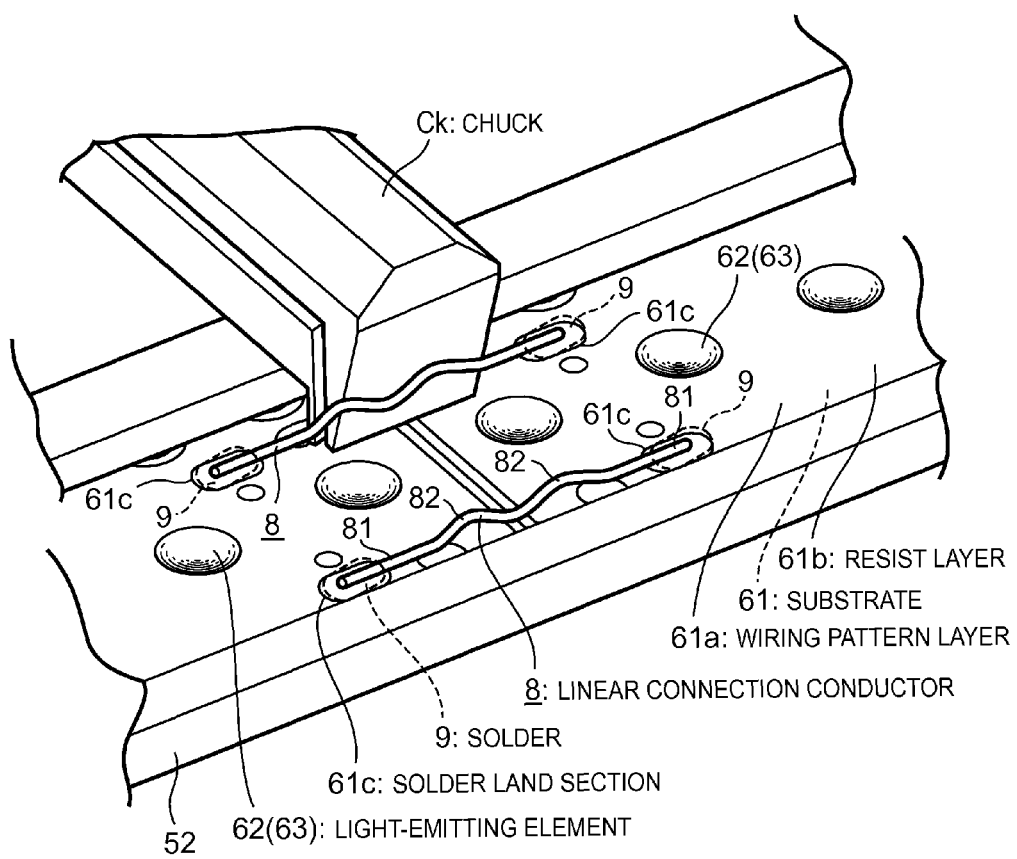
FIG. 5 is a perspective view of a part of a joining process for a linear conductor and a state in which the linear conductor is supplied to a substrate side.
Figure 6:
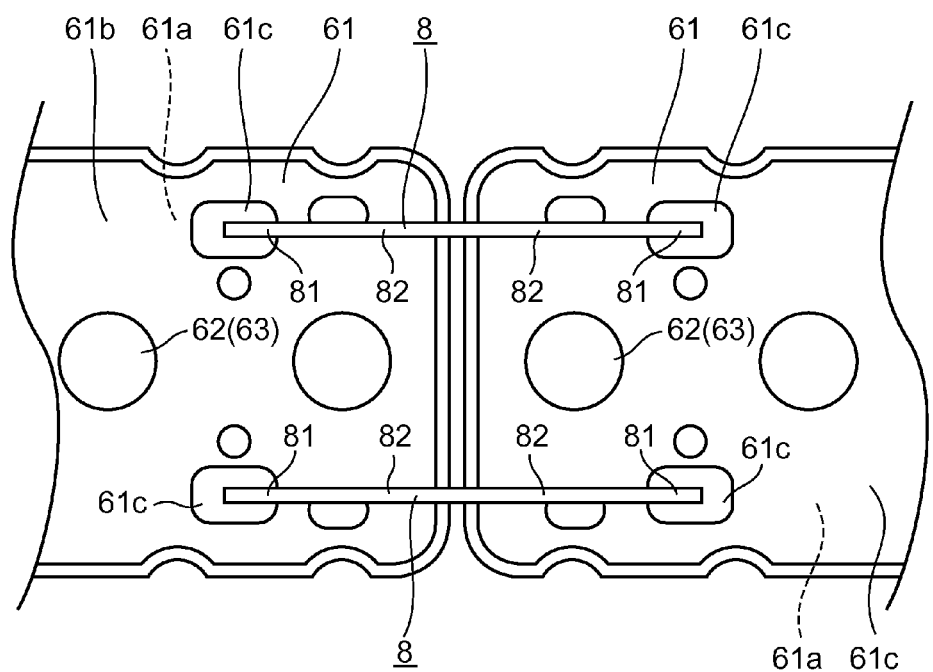
FIG. 6 is an enlarged plan view of a portion to which the linear conductor is connected.
Figure 7:
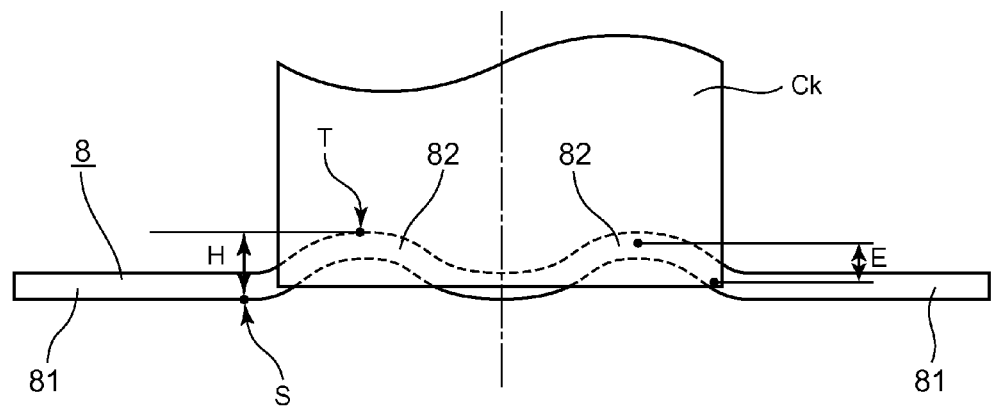
FIG. 7 is a front view of a state in which the linear conductor is grasped by a chuck of a component automatic supply machine.
Figure 8:
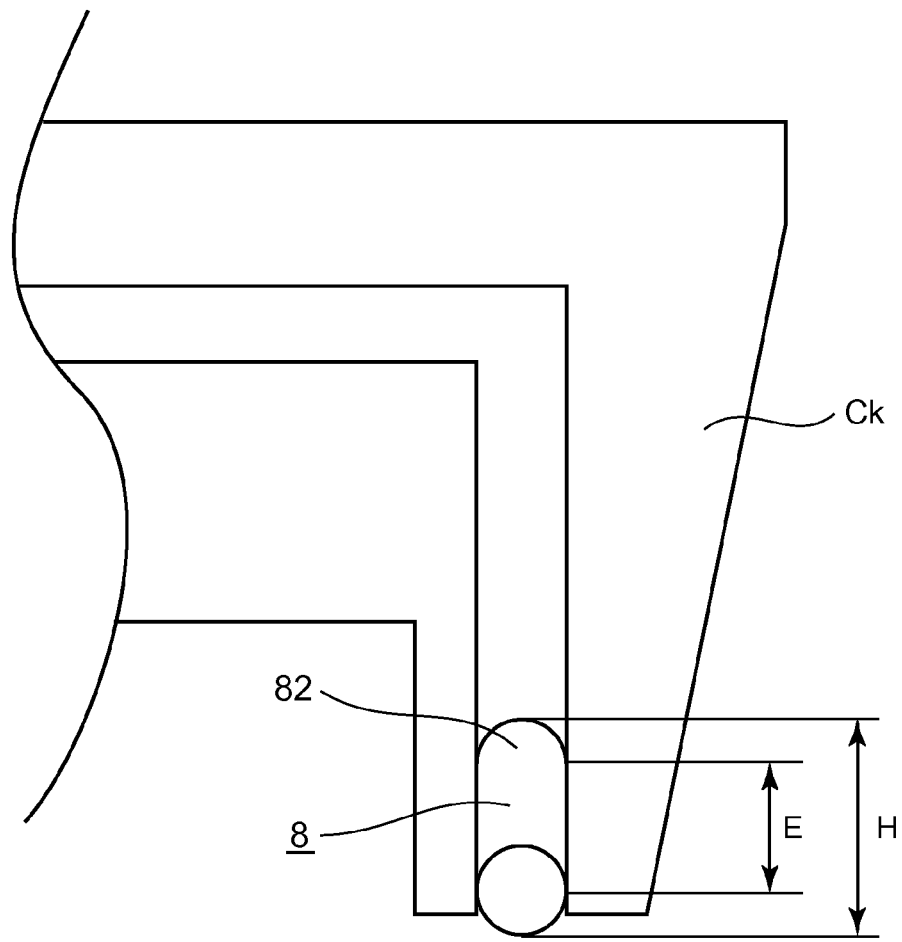
FIG. 8 is a side view of a state in which the linear conductor is grasped by the chuck of the component automatic supply machine.
Figure 16:
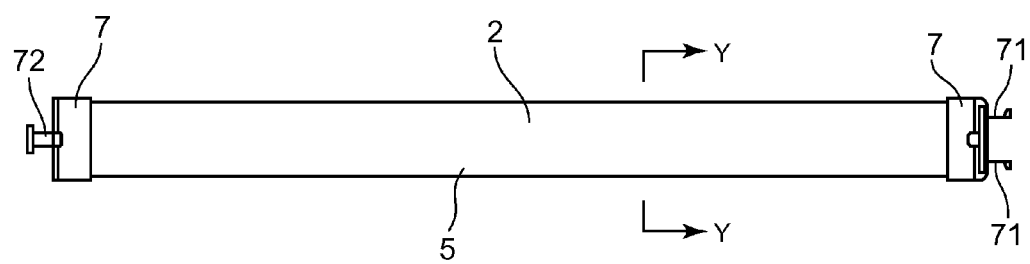
FIG. 16 is a side view of a direct tube type LED lamp.

A first embodiment is explained below with reference to FIGS. 1 to 14 and FIG. 16. FIG. 1 is a diagram of a luminaire. FIG. 2 is a diagram of a direct tube type LED lamp functioning as a luminaire. FIGS. 3 to 6 are diagrams of a light source section. FIGS. 7 and 8 are diagrams of a linear conductor. FIGS. 9A and 9B to FIG. 14 are diagrams for explaining joining process for the linear conductor. In the figures, the same components are denoted by the same reference numerals and signs and redundant explanation of the components is omitted. FIG. 16 is a diagram of a direct tube type LED lamp functioning as a luminaire.

In FIG. 1, a luminaire set on the ceiling surface is shown. The luminaire includes a luminaire main body 1 having a laterally-long substantially parallelepiped shape formed of a cold rolled steel plate or the like and a direct tube type LED lamp 2 attached to the luminaire main body 1.

The luminaire main body 1 basically has an existing configuration. The luminaire main body 1 is formed in a box shape including an open section opened on the lower surface side. The luminaire main body 1 includes a pair of socket sections 3 attached to both ends in the longitudinal direction of the luminaire main body 1, a lighting circuit 4 housed in the luminaire main body 1, and a reflection plate 11 attached to cover the open section on the lower surface side.

The socket sections 3 are made of PBT resin or the like. Power supply terminals 71 and an earth terminal 72 projecting from both ends of the direct tube type LED lamp 2 shown in FIG. 16 are connected to the socket sections 3.

The lighting circuit 4 is connected to a commercial alternating-current power supply AC. The lighting circuit 4 includes a diode bridge circuit that receives electric power of the alternating-current power supply AC and generates a direct-current output. The lighting circuit 4 is configured by, for example, connecting a smoothing capacitor between output terminals of the diode bridge circuit and connecting a direct-current voltage converting circuit and a current detecting section to the smoothing capacitor. An output end of the lighting circuit 4 is connected to a terminal of one socket section 3.

The reflection plate 11 has a reflection surface. The reflection plate 11 is attached to cover the open section on the lower surface side of the luminaire main body 1. Substantially rectangular cutout sections, in which the socket sections 3 fit, are formed at both ends in the longitudinal direction of the reflection plate 11.

As shown in FIGS. 1 to 3 and FIG. 16, in this embodiment, the direct tube type LED lamp 2 functioning as a luminaire has dimensions and an external shape substantially the same as those of an existing direct tube type fluorescent lamp. Specifically, for example, the direct tube type LED lamp 2 has dimensions and an external shape substantially the same as those of 20 W and 40 W direct tube type fluorescent lamps. The direct tube type LED lamp 2 is configured based on Japan Electric Lamp Manufactures Association Standard JEL801 "Direct Tube Type LED lamp system with L-shape Pin Cap GX16t-5 (for general lighting)".

The direct tube type LED lamp 2 includes an elongated main body 5 having a substantially cylindrical shape in external appearance, a light source section 6, and cap sections 7.

As shown in FIG. 2, the main body 5 has an internal space. The main body 5 is formed in a substantially cylindrical shape and manufactured by extrusion molding from a synthetic resin material such as translucent polycarbonate resin having diffusibility. On the inner wall of the main body 5, a pair of supporting rails 51 opposed to each other and projecting to the inner side is formed. An elongated attachment member 52 is supported by the supporting rails 51 and disposed along the longitudinal direction of the main body 5. The attachment member 52 is a thermal radiation member and is formed by the extrusion molding from an aluminum material or the like having satisfactory heat conductivity.

A molding method for the main body 5 is not specifically limited. For example, the main 1 body 5 may be configured by combining two semi cylindrical members. Further, the cross section of the main body 5 may be a polygonal shape as long as the internal space can be formed. The shape of the main body 5 is not limited.

The light source section 6 is configured by a light-emitting circuit. The light source section 6 includes a substrate 61, a plurality of light-emitting elements 62 linearly arranged and mounted on the substrate 61, and a phosphor layer 63 that covers the light-emitting elements 62. A plurality of the substrates 61 are arranged and disposed in the longitudinal direction of the light source section 6.

The substrate 61 is formed in a rectangular shape from an insulating material, for example, a tabular material such as a glass composite substrate (CEM-3) or a glass epoxy substrate (FR-4). A wiring pattern layer 61a formed of a copper foil is formed on the front surface side of the substrate 61. A resist layer 61b is laminated on the wiring pattern layer 61a as appropriate. The resist layer 61b is a white resist layer having high reflectance. The resist layer 61b is laminated over substantially the entire surface of the front layer of the substrate 61 excluding a mounting region of the light-emitting elements 62 and solder land sections 61c to which linear conductors 8 explained below are joined (see FIGS. 5 and 6 as well).

A plurality of such substrates 61 are thermally combined such that the rear surface side of the substrates 61 adheres to the attachment member 52. The substrates 61 are slid and inserted into the attachment member 52 from the end side and fixed and disposed. Specifically, a slender elongated substrate 611 is disposed in the center. Short substrates 612 are arranged and disposed to be adjacent to both sides of the substrate 611. The substrate 61 is divided and disposed over the entire length in the longitudinal direction of the substrate 61. In this case, a plurality of, for example, two or three substrates having the same length may be disposed to form the substrate 61.

As the material of the substrate 61, a glass epoxy substrate (FR-4), a ceramic substrate, or abase substrate made of metal obtained by laminating an insulating layer over the entire surface of a base plate having satisfactory heat conductivity and excellent in thermal radiation properties such as aluminum to improve the thermal radiation properties of a ceramic material, a synthetic resin material, or the light-emitting elements 62 may be used. The material of the substrate 61 is not specifically limited.

The light-emitting elements 62 include bare chips of LEDs. As the bare chips of the LEDs, for example, bare chips that emit blue light are used in order to cause a light-emitting section to emit white light. The bare chips of the LEDs are bonded on the substrate 61 using a silicone resin insulative adhesive and electrically connected onto the wiring pattern layer 61a by a bonding wire.

The phosphor layer 63 is made of translucent synthetic resin, for example, transparent silicone resin. The phosphor layer 63 contains an appropriate amount of a phosphor such as YAG:Ce. The phosphor layer 63 is formed in a mountain shape that covers the respective light-emitting elements 62 one by one. The phosphor is excited by light emitted by the light-emitting elements 62 to radiate light having a color different from a color of the light emitted by the light-emitting elements 62. In this embodiment in which the light-emitting elements 62 emit blue light, a yellow phosphor that radiates yellow light having a complementary color relation with the blue light is used as the phosphor in order to make it possible to emit white light.

As the light-emitting elements, an LED package of a surface mount type may be used. Alternatively, LEDs of a bullet type may be mounted. A mounting method and a mounting form of the light-emitting elements are not specifically limited.

As shown in FIGS. 1 and 2, the cap sections 7 are made of a synthetic resin material such as PBT resin. The cap sections 7 are provided at both ends in the longitudinal direction in the main body 5. The cap sections 7 are configured to be capable of being attached to the socket sections 3 of the luminaire main body 1. Power supply terminals are provided to project from one cap section 7. An earth terminal is provided to project from the other cap section 7.

Figure 3:
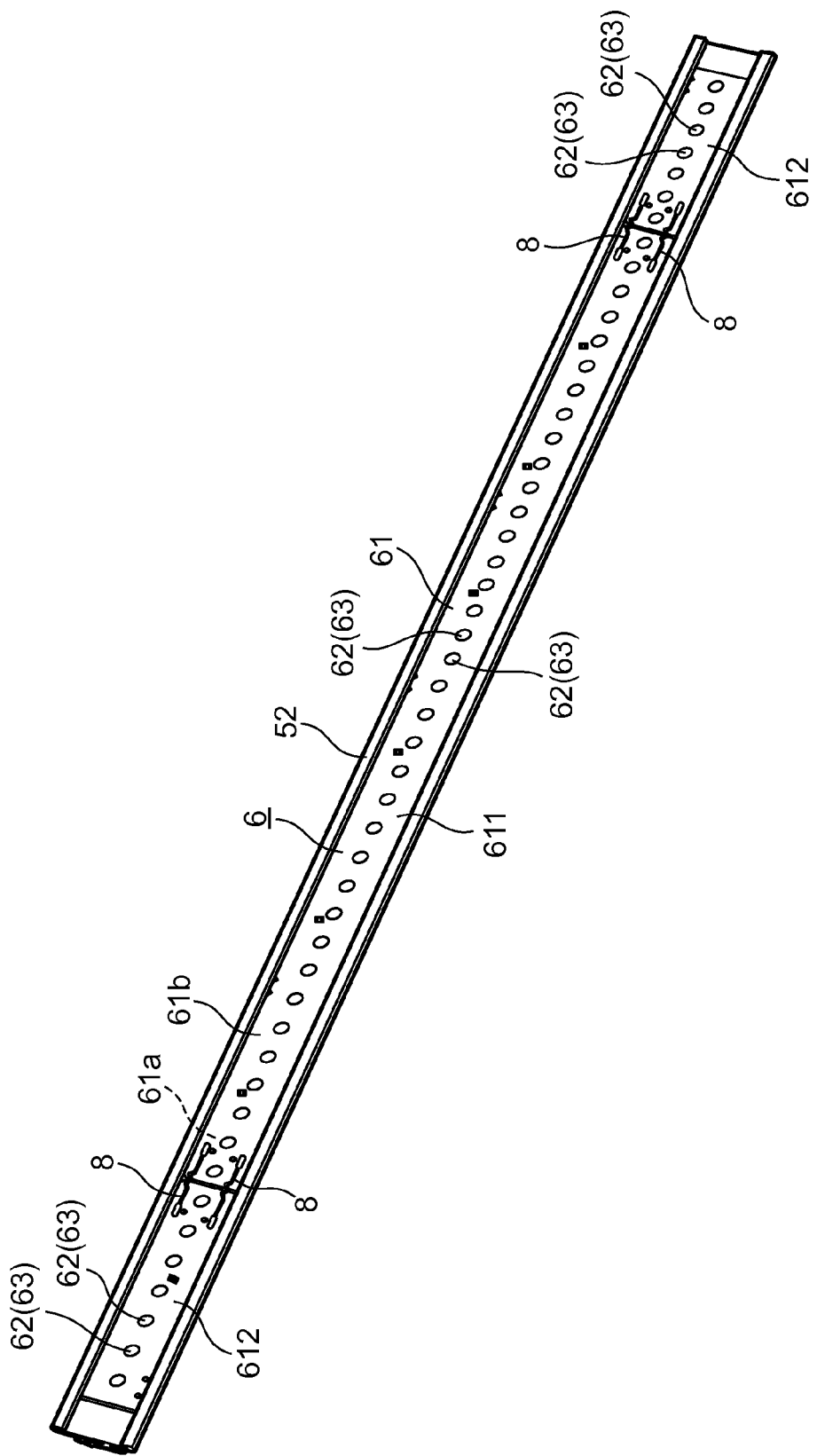
FIG. 3 is a perspective view of a light source section (a light-emitting circuit) in a direct tube type LED lamp.
Figure 4:
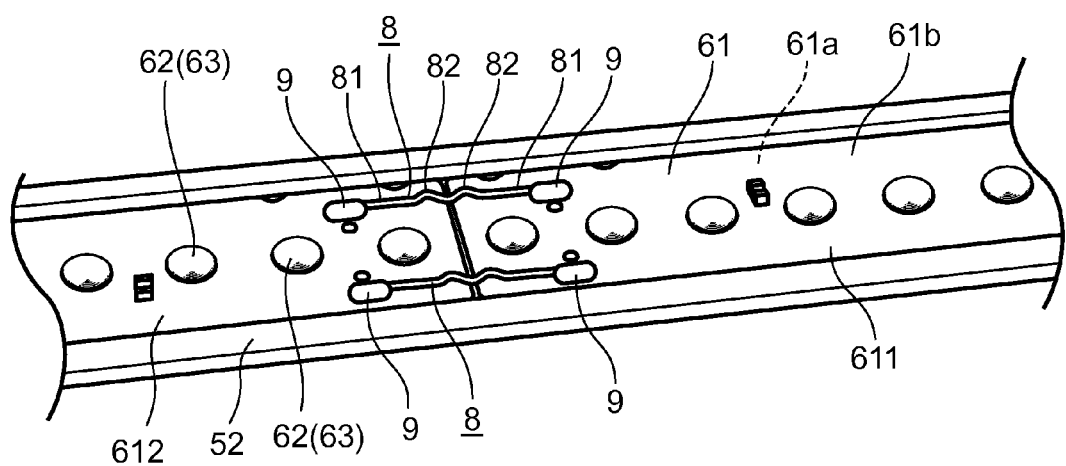
FIG. 4 is an enlarged diagram of a main part shown in FIG. 3.

The linear conductors 8 joined and electrically connected over the plurality of substrates 61 is explained with reference to FIGS. 3 to 8. FIG. 3 is a diagram of the entire light-emitting circuit in which the substrates 61 are disposed. FIG. 4 is an enlarged diagram of portions to which the linear conductors 8 are connected. FIG. 5 is a diagram of a part of a joining process for the linear conductor 8 and a state in which the linear conductor 8 is grasped by a chuck Ck of a component automatic supply machine and supplied to the substrate 61 side. FIG. 6 is an enlarged plan view of the portion to which the linear conductor 8 is connected. FIGS. 7 and 8 are a front view and a side view of a state in which the linear conductor 8 is grasped by the chuck Ck of the component automatic supply machine.

The linear conductor 8 is a linear member having a circular shape in section and electric conductivity. Specifically, the linear conductor 8 is a φ0.5 tin-plated CP wire obtained by tin-plating a copper-covered steel wire. The linear conductor 8 is molded to include linear joining sections at both ends. A convex section 82 is formed in the intermediate section between the joining sections 81. A plurality of, specifically, a pair of the convex sections 82 are formed. The convex sections 82 are bent in a convex shape and formed in a mountain shape.

As representatively shown in FIG. 7, a ratio H/φ of a height dimension H of the convex sections 82 to a wire diameter dimension φ of the linear member is desirably 2 to 3. In this embodiment, the height dimension H of the convex sections 82 is set to 1.2 mm to 1.4 mm. H/φ is 2.4 to 2.8. The height dimension H of the convex sections 82 is a height dimension from a start point S of bending to a top T of the convex sections 82 in a direction opposite to a direction in which the convex sections 82 bend in a convex shape.

An expansion and contraction amount of the linear conductor 8 is set to about 1 mm to 2 mm. In other words, the length dimension is set to be longer by 1 mm to 2 mm when the linear conductor 8, in which the convex sections 82 are formed, is linearly extended. The dimension of 1 mm to 2 mm can be absorbed by the convex sections 82 to make the expansion and contraction allowable.

The number of the convex sections 82 formed in the linear conductor 8 may be one and is not specifically limited. The linear member is not limited to a circular wire having a circular shape in section and may be, for example, a square wire having a square shape. In this case, a wire diameter dimension is equivalent to the dimension of one side of the square shape.

In such a linear conductor 8, as shown in FIG. 5, the convex sections 82 are caught and grasped by the chuck CK of the component automatic supply machine and the joining sections 81 are arranged in the solder land sections 61c formed on the substrates 61. As shown in FIG. 6, a pair of the solder land sections 61c is formed on each of end sides of the substrates 61 adjacent to each other. The solder land sections 61c are a part of the wiring pattern layer 61a and are portions where the wiring pattern layer 61a, on which the resist layer 61b is not laminated, is exposed to the surface and formed in a corner-rounded rectangular shape.

After the joining sections 81 of the linear conductor 8 are arranged in the solder land sections 61c, the joining sections 81 are soldered and electrically connected to the solder land sections 61c.

The linear conductor 8 is joined to the solder land sections 61c, whereby the substrates 61 are electrically connected to each other and electric power is supplied from the power supply side to the light-emitting elements 62. In FIG. 5, solder 9 is indicated by a broken line. In FIG. 6, the solder 9 is not shown.

As explained above, the convex sections 82 of the linear conductor 8 function as catching margins for the chuck Ck of the component automatic supply machine. Therefore, the linear conductor 8 can be stably grasped by the chuck Ck and supplied to the substrate 61 side so that the linear conductor 8 is suitable for automation. As shown in FIGS. 7 and 8, the ratio of the height dimension H of the convex sections 82 to the wire diameter dimension φ of the linear member is set to 2 to 3. Consequently, since at least a catching margin dimension E equivalent to the wire diameter dimension φ can be secured, it is possible to stably catch and grasp the linear conductor 8 with the chuck Ck. On the other hand, the height dimension H of the convex 1 sections 82 is specified to a predetermined height. Therefore, it is possible to prevent the convex sections 82 from becoming obstacles to light emitted from the light-emitting elements 62.

A predetermined expansion and contraction amount of the linear conductor 8 can be secured because the convex sections 82 are formed. Further, since the plurality of convex sections 82 are formed, when the predetermined expansion and contraction amount is secured, it is possible to reduce the height dimension H of the convex sections 82 and improve the effect of preventing the convex sections 82 from becoming obstacles to light.

A manufacturing method for the light-emitting circuit, specifically, a joining process for the linear conductor 8 is explained with reference to FIGS. 9A and 9B to FIG. 14.

Figure 9A:
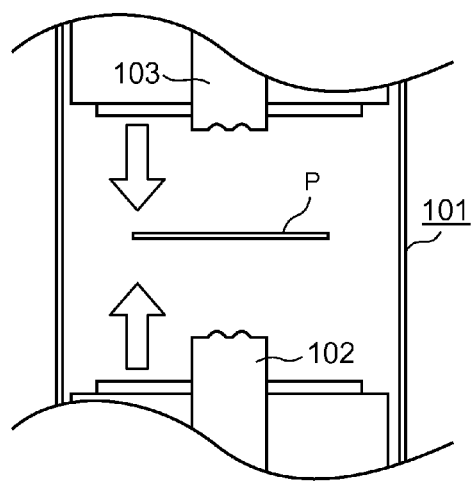
FIGS. 9A and 9B are diagrams for schematically explaining a molding process for the linear conductor.
Figure 9B:
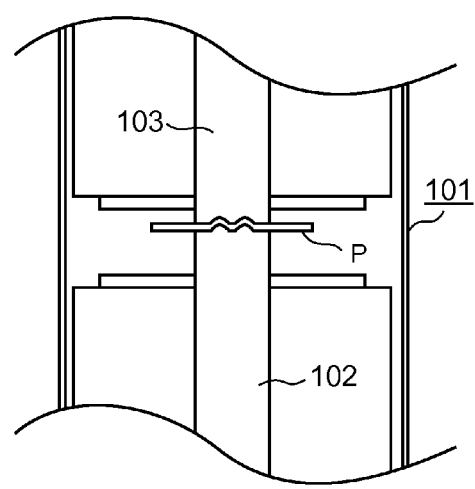
Figure 10:
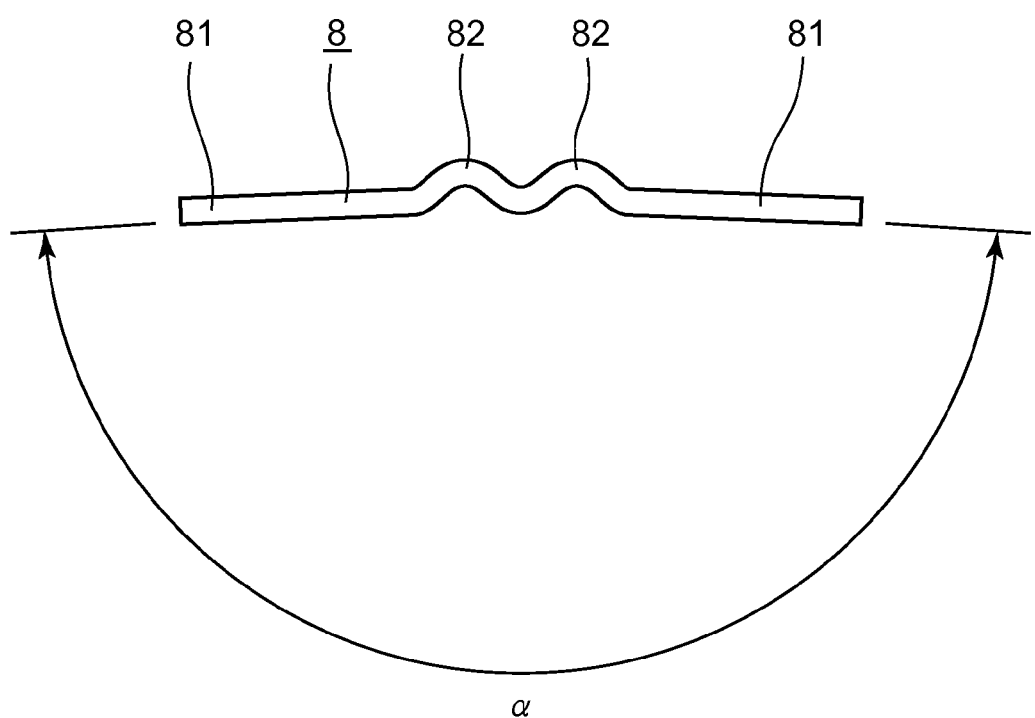
FIG. 10 is a front view of the linear conductor after the molding.

FIGS. 9A and 9B are diagrams for schematically explaining a molding process for the linear conductor 8. FIG. 10 is a diagram of the linear conductor 8 after the molding. FIGS. 11A to 11C to FIG. 14 are diagrams for schematically explaining a joining process (a soldering process) for the linear conductor 8.

First, as shown in FIGS. 9A and 9B and FIG. 10, the linear conductor 8 is molded by, for example, a pressure forming machine 101. A molding die 102 on the lower side and a molding die 103 on the upper side are mounted on the pressure forming machine 101. Two convex sections are formed on the molding die 102 on the lower side. Concave sections are formed on the molding die 103 on the upper side to correspond to the convex sections of the molding die 102 on the lower side.

As shown in FIG. 9A, a linear member P is interposed between the molding dies 102 and 103. The molding dies 102 and 103 are driven to press-mold the linear member between the molding dies 102 and 103 as shown in FIG. 9B.

The linear conductor 8 is molded as explained above. More specifically, as shown in FIG. 10, the linear joining sections 81 at both the ends are not straight in a relation between the joining sections 81. In other words, between the joining sections 81 at both the ends, an interior angle α having a vertex in the intermediate section is set to be smaller than 180 degrees to form a small angle. In this embodiment, the interior angle α is set to about 175 degrees. When stability of joining in a joining process explained below is taken into account, it is appropriate to set the interior angle α desirably to be equal to or larger than 160 degrees and smaller than 180 degrees.

Figure 11A:
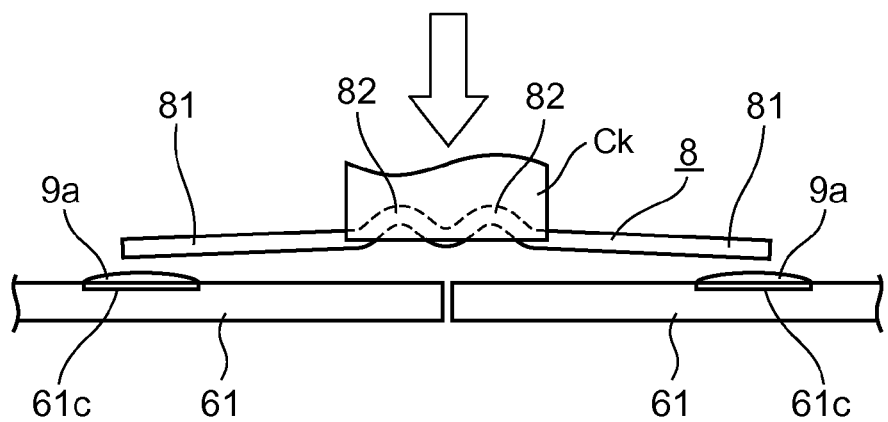
FIGS. 11A to 11C are diagrams for schematically explaining a joining process for the linear conductor.
Figure 11B:
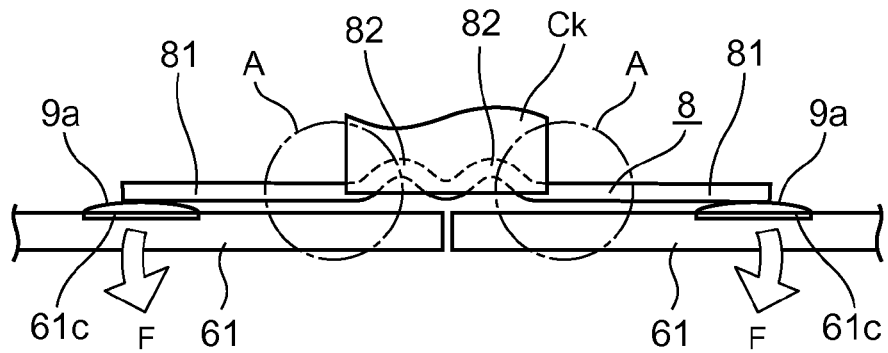
Figure 11C:
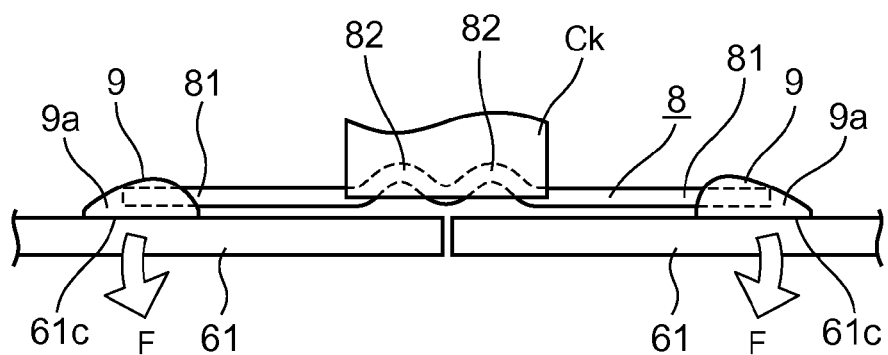
Figure 12:
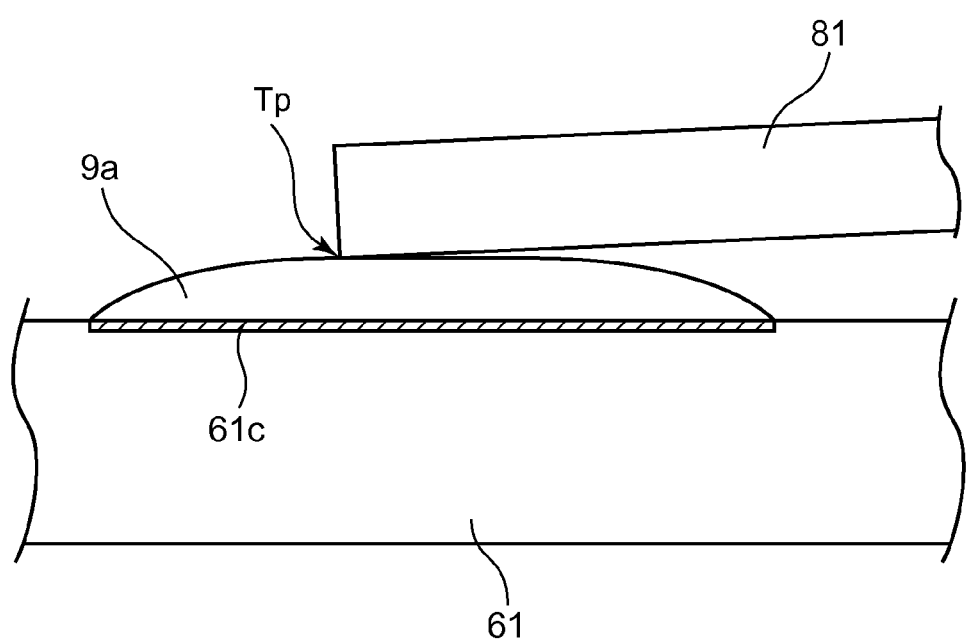
FIG. 12 is an enlarged diagram of a state of the linear conductor in the joining process for the linear conductor.

As shown in FIGS. 11A to 11C, the linear conductor 8 is soldered and joined to the solder land section 61c in order to electrically connect the substrates 61 adjacent to each other.

As shown in FIG. 11A, the convex sections 82 of the linear conductor 8 are caught and grasped by the chuck Ck of the component automatic supply machine. The joining sections 81 of the linear conductor 8 are located on the solder land sections 61c formed on the substrate 61. Spare solder 9a for preventing oxidation of the solder land sections 61c and protecting the solder land sections 61c is applied to the solder land sections 61c.

When the chuck Ck is lowered from this state, as shown in FIG. 11B, distal ends in the joining sections 81 at both the ends of the linear conductors 8 come into contact with the solder land section 61c, i.e. the spare solder 9a first. When the chuck Ck is further lowered, the joining sections 81 of the linear conductor 8, the interior angle α of which is set to be equal to or smaller than 180 degrees, changes to a linear state (about 180 degrees) and the linear conductor 8 changes to a set state. In this case, in FIG. 12, a state in which a distal end Tp in the joining section 81 comes into contact with the spare solder 9a first is shown.

In the set state of the linear conductor 8, the joining sections 81 of the linear conductor 8 come into linear contact with the spare solder 9a. With the elasticity of the linear conductor 8, force F for pressing the joining sections 81 against the solder land sections 61c side acts with a portion near A in the figure as a fulcrum.

In the set state of the linear conductor 8, as shown in FIG. 11C, an automatic soldering apparatus is driven to solder and join the joining sections 81 of the linear conductor 8 to the solder land sections 61c. After the joining, the grasp of the linear conductor 8 by the chuck Ck is released and the chuck Ck returns to the original position.

Figure 13:
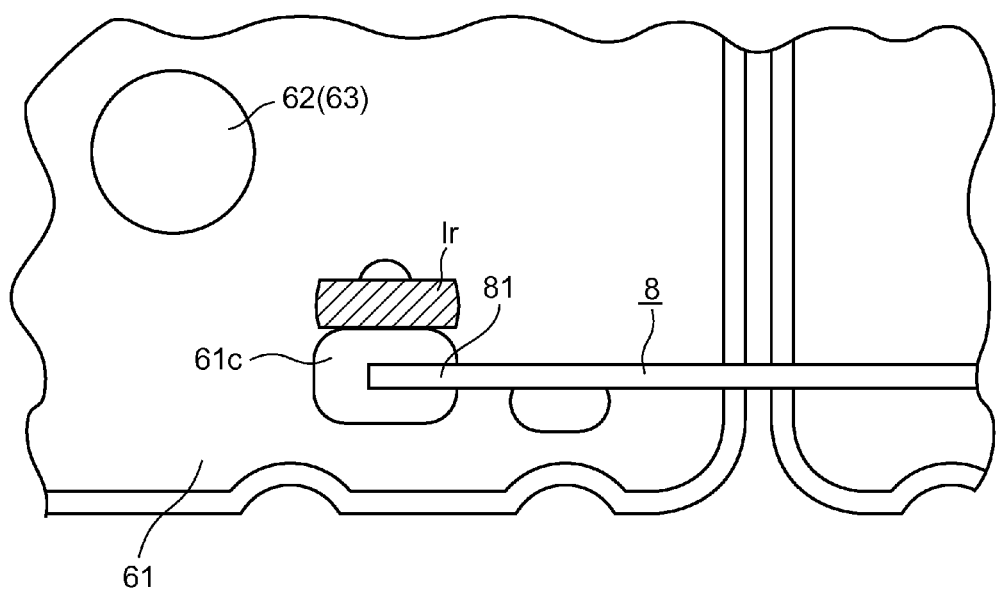
FIG. 13 is a plan view for explaining a positional relation among a solder land section, a light-emitting element, and a soldering iron in the joining process for the linear conductor.
Figure 14:
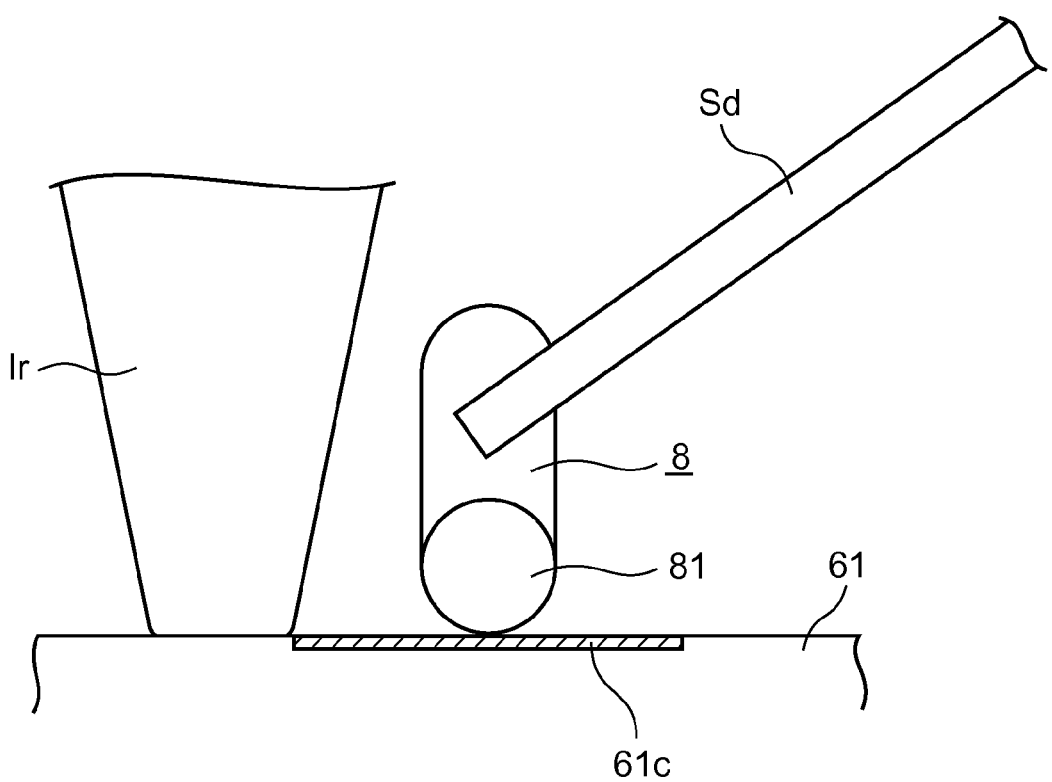
FIG. 14 is a side view for explaining a positional relation among the solder land section, the soldering iron, and a solder material in the joining process for the linear conductor.

In the soldering, as shown in FIGS. 13 and 14, a soldering iron Ir is arranged between the solder land sections 61c and the light-emitting elements 62 to perform the soldering (in FIGS. 13 and 14, the spare solder 9a is not shown). Specifically, the solder iron Ir is arranged in a position between the solder land sections 61c and a row of the light-emitting elements 62, near the solder land sections 61c, and not in contact with the solder land sections 61c (the spare solder 9a). Wire solder Sd used as a solder material is supplied from the solder land sections 61c side to perform the soldering.

In the joining process for the linear conductor 8, in the set state of the linear conductor 8, the force F for pressing the joining sections 81 against the solder land sections 61c side acts. Therefore, the joining sections 81 adhere to the solder land sections 61c side. For example, it is possible to prevent a phenomenon in which the distal end of the joining sections 81 are exposed from the melted solder 9.

Therefore, it is possible to secure stability of joining and improve reliability of electric connection.

In the soldering, the soldering iron Ir is arranged between the solder land section 61c and the light-emitting element 62. The solder material is supplied from the solder land sections 61c side. Therefore, even if a phenomenon in which a solder ball is formed and scattered occurs because of various causes such as overheating of the soldering iron Ir, the soldering iron Ir acts as a blocking wall against the scattered solder ball. It is possible to prevent the solder ball from being scattered to the light-emitting elements 62 side.

Further, the solder iron Ir is arranged in the position not in contact with the solder land section 61c (the spare solder 9a). Therefore, it is possible to prevent the solder ball from being formed from the spare solder 9a. In addition, the soldering iron Ir is not arranged in a position where the soldering iron Ir prevents the melted solder material from flowing to the regions of the solder land sections 61c. Therefore, it is possible to surely feed the solder material to the solder land sections 61c.

In the luminaire configured as explained above, when electric power is supplied to the lighting circuit 4, electricity is supplied from the socket sections 3 and the cap sections 7 to the plurality of substrates 61 via the linear conductor 8. The electric power is supplied to the light-emitting elements 62. The light-emitting elements 62 are turned on. Light emitted from the light-emitting elements 62 is transmitted through the translucent main body 5 and radiated downward. A predetermined range is irradiated.

In this case, connectors or the like for electrically connecting the substrates 61 are not used and the linear conductors 8 are used. Therefore, it is possible to prevent the connectors or the like from becoming obstacles to light emitted from the light-emitting elements 62.

Heat is generated during lighting of the light-emitting elements 62. The substrates 61 are heated and cooled when the light-emitting elements 62 are turned on and off. The substrates 61 expand and contract mainly in the longitudinal direction. Further, the substrates 61 sometimes expand and contract in a torsion direction or laterally shift from each other because of vibration or the like. The expansion and contraction and the shift occur in the various directions in this way. However, the substrates 61 are connected by the linear conductors 8 in which the convex sections 82 are formed. Therefore, it is possible to absorb the expansion and contraction and the shift with the linear conductors 8 and it is possible to reduce a load applied to the soldered portion. Further, since the linear conductors 8 are formed in the circular shape in section, it is possible to effectively realize the absorbing action for the expansion and contraction and the shift in the various directions. As explained above, according to this embodiment, it is possible to provide the linear conductors 8 that can reduce a load applied to the joined portion (the soldered portion) and is suitable for automation of the joining process.

Figure 15:
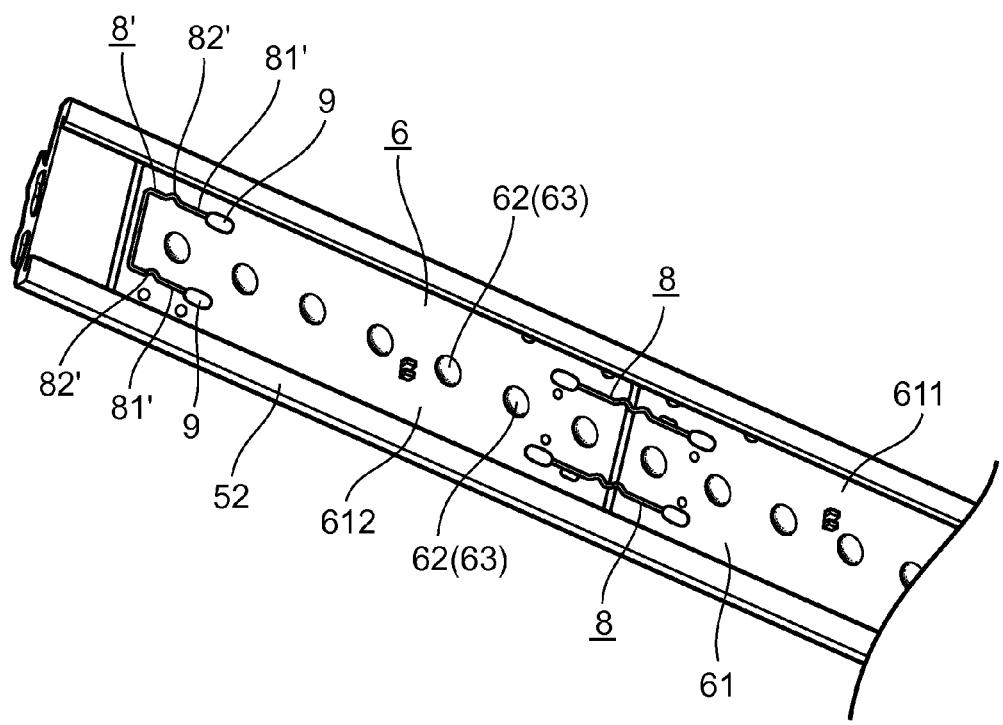
FIG. 15 is a perspective view of a linear conductor in a light source section (a light-emitting circuit) according to a second embodiment.

A second embodiment is explained with reference to FIG. 15. FIG. 15 is a diagram of an end side of the light source section 6. Components same as or equivalent to those in the first embodiment are denoted by the same reference numerals and signs and redundant explanation of the components is omitted.

A linear conductor 8' according to this embodiment is used to return connection from a positive electrode side terminal of the substrate 61 connected to the power supply side to a negative electrode side terminal of the substrate 61 through the plurality of light-emitting elements 62, for example, to connect a cathode side of the light-emitting element 62 at the end of the plurality of light-emitting elements 62 included in a series circuit and a return line to the negative electrode side terminal. The linear conductor 8' is basically the same as the linear conductor 8 according to the first embodiment. The linear conductor 8' is soldered and joined to the solder land sections of the substrate 61.

The linear conductor 8' includes linear joining sections 81' at both ends. The linear conductor 8' is configured to be bent in a substantially C shape. Convex sections 82' are formed on opposed two sides of the substantially C shape. Therefore, the convex sections 82' are formed to be bent in the intermediate sections of the linear joining sections 81'.

With such a configuration, the linear conductor 8' is suitable for automation of a joining process. Effects same as the effects in the first embodiment can be expected.

The present invention is not limited to the configurations in the embodiments. Various modifications are possible without departing from the spirit of the invention. The embodiments are only presented as examples and are not intended to limit the scope of the invention.

In the embodiments, as the direct tube type LED lamp functioning as the luminaire, the direct tube type LED lamp configured based on Japan Electric Lamp Manufactures Association Standard JEL801 is explained. However, the direct tube type LED lamp is not limited to this. Configurations not conforming to this standard are also allowed.

The joining of the linear conductors is desirably joining by soldering. However, application of joining methods such as joining by an adhesive and joining by press contact is not prevented.

Further, the luminaire can be applied to a lamp, a luminaire used outdoor or indoor, a display device, and the like.

Figure 17:
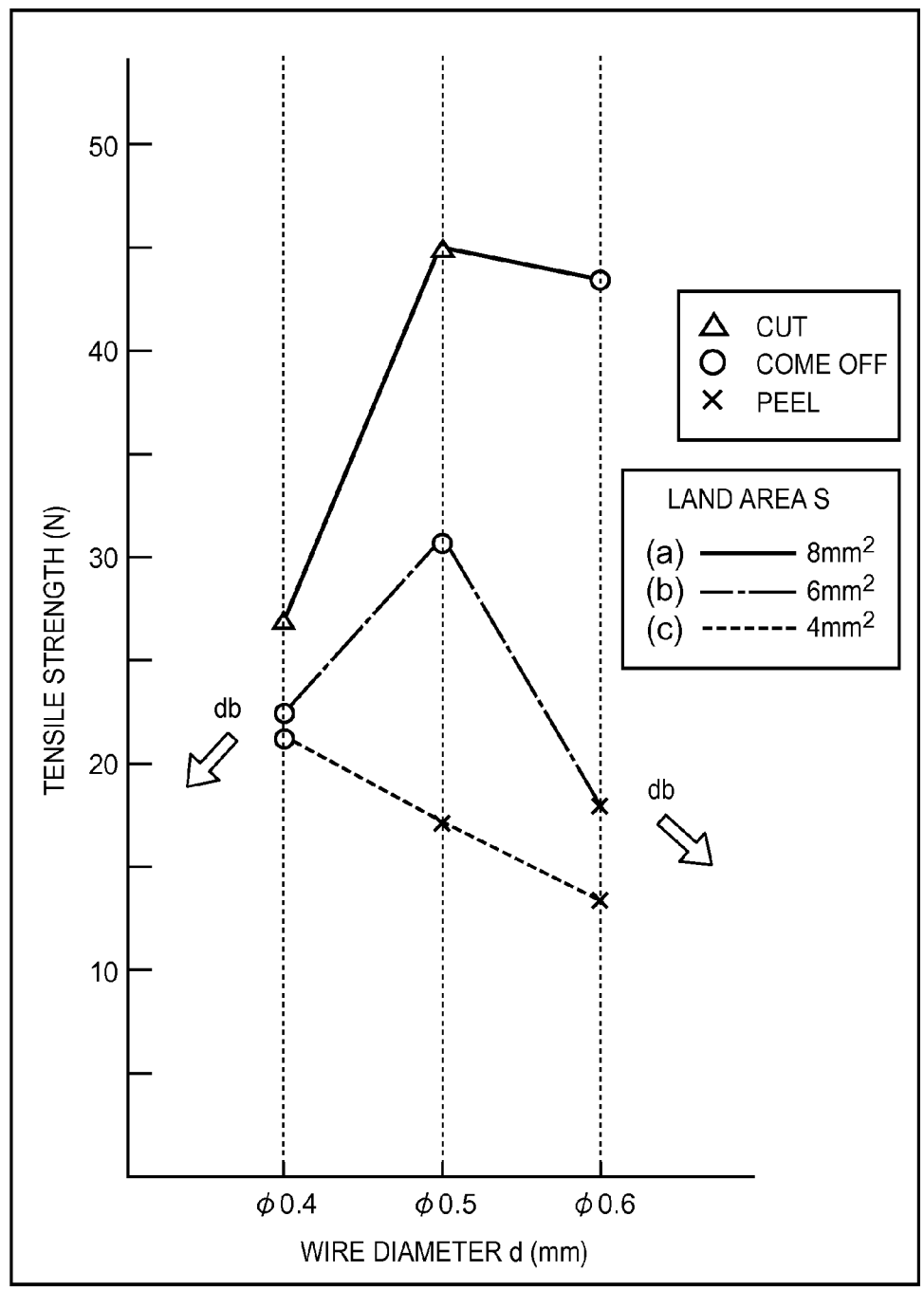
FIG. 17 is a graph of the tensile strength of a lead wire in a state in which the lead wire is joined.
Figure 18:
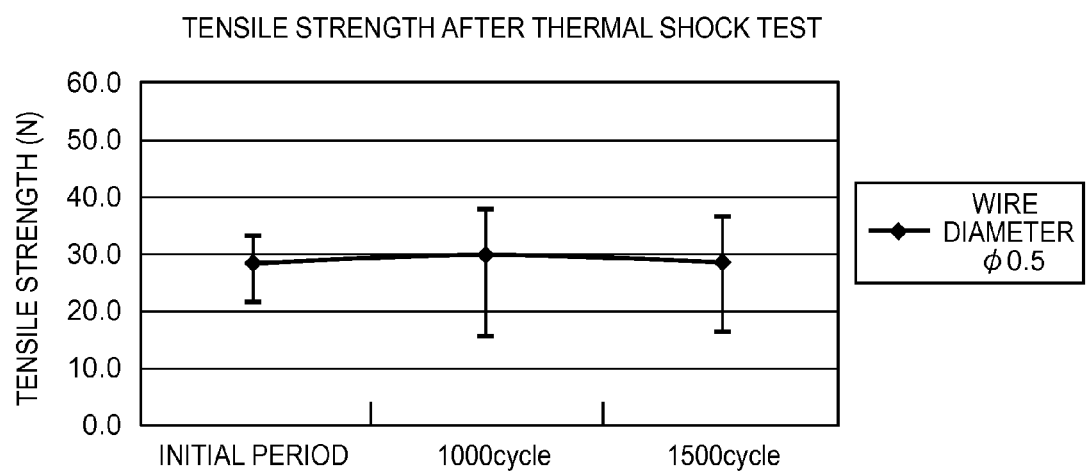
FIG. 18 is a graph of the tensile strength of the lead wire after a thermal shock test.

Another embodiment is explained with reference to FIGS. 1 to 6 and FIGS. 16 and 18. FIG. 1 is a diagram of a luminaire. FIGS. 2 and 16 are diagrams of a direct tube type LED lamp functioning as a luminaire. FIGS. 3 to 6 are diagrams of a light source section. FIGS. 17 and 18 are graphs of results of a tensile strength test of a lead wire. In the figures, the same components are denoted by the same reference numerals and signs. Further, the luminaire, the direct tube type LED lamp functioning as the luminaire, the light source section, and the like shown in FIGS. 1 to 6 and the like are the same as those in the embodiments explained above. Therefore, explanation of the luminaire, the direct tube type LED lamp functioning as the luminaire, the light source section, and the like is omitted.

As representatively shown in FIGS. 5 and 6, two solder land sections 61c are formed on each of the end sides of the substrates 61 adjacent to each other. The solder land sections 61c are a part of the wiring pattern layer 61a where the resist layer 61b is not laminated and the wiring pattern layer 61a is exposed to the surface and formed in a corner-rounded rectangular shape. An area S of the solder land sections 61c is set to 6 mm$^2$.

Lead wires 8 are joined to the solder land sections 61c by soldering, whereby the substrates 61 are electrically connected each other and electric power is supplied from the power supply side to the light-emitting elements 62. In FIG. 5, the solder 9 is indicated by a broken line and is not shown in FIG. 6.

The lead wire 8 is a linear conductor and is a linear member having a circular shape in section and electric conductivity. Specifically, the lead wire 8 is a ϕ0.5 tin-plated CP wire obtained by tin-plating a copper-covered steel wire. The lead wire 8 includes the linear joining sections 81 at both ends. Convex sections 82 are formed in the intermediate section between the joining sections 81.

The joining sections 81 of the lead wire 8 are portions soldered to the solder land sections 61c. The convex sections 82 have a function of absorbing expansion and contraction of the substrate 61 due to heat. When the lead wire 8 is grasped by the chuck Ck of the component automatic supply machine, the joining sections 81 are portions functioning as catching margins for the lead wire 8.

Specifically, as shown in FIG. 5, the convex sections 82 of the lead wires 8 are caught and grasped by the chuck Ck of the component automatic supply machine. The joining sections 81 are arranged in and soldered to the solder land sections 61c formed on the substrates 61. In other words, the lead wires 8 are joined over the substrates 61 adjacent to each other.

The lead wire 8 is not limited to a circular wire having a circular shape in section and may be, for example, a square wire having a square shape. In this case, a wire diameter dimension is equivalent to the dimension of one side of the square shape.

In this embodiment, in order to secure joining strength of a soldered and joined portion of the lead wire 8, with attention paid to a relation between the area S of the solder land section 61c and the wire diameter dimension d of the lead wire 8, the area S of the solder land section 61c is set to 6 mm$^2$ and the wire diameter dimension d of the lead wire 8 is set to ϕ0.5. As explained below, by setting the area S and the wire diameter dimension d in such a relation, it is possible to secure predetermined joining strength.

The light-emitting elements 62 include bare chips of LEDs. As the bare chips of the LEDs, for example, bare chips that emit blue light are used in order to cause a light-emitting section to emit white light. The bare chips of the LEDs are bonded on the substrate 61 using a silicone resin insulative adhesive and electrically connected onto the wiring pattern layer 61a by a bonding wire.

The phosphor layer 63 is made of translucent synthetic resin, for example, transparent silicone resin. The phosphor layer 63 contains an appropriate amount of a phosphor such as YAG:Ce. The phosphor layer 63 is formed in a mountain shape that covers the respective light-emitting elements 62 one by one. The phosphor is excited by light emitted by the light-emitting elements 62 to radiate light having a color different from a color of the light emitted by the light-emitting elements 62. In this embodiment in which the light-emitting elements 62 emit blue light, a yellow phosphor that radiates yellow light having a complementary color relation with the blue light is used as the phosphor in order to make it possible to emit white light.

As the light-emitting elements, an LED package of a surface mount type may be used. Alternatively, LEDs of a bullet type may be mounted. A mounting method and a mounting form of the light-emitting elements are not specifically limited.

As representatively shown in FIGS. 1 and 16, the cap sections 7 are made of a synthetic resin material such as PBT resin. The cap sections 7 are provided at both ends in the longitudinal direction in the main body 5. The cap sections 7 are configured to be capable of being attached to the socket sections 3 of the luminaire main body 1. The power supply terminals 71 are provided to project from one cap section 7. The earth terminal 72 is provided to project from the other cap section 7.

In manufacturing the light-emitting circuit explained above, the inventor performed various investigations and measurements in order to secure joining strength of the soldered and joined portion of the lead wire 8. As a result, the inventor ended in focusing on the relation between the wire diameter dimension d of the lead wire 8 and the area S of the solder land section 61c.

Therefore, the inventor prepared samples in which the wire diameter dimension d (mm) of lead wires and the area S (mm$^2$) of solder land sections were changed. The inventor repeatedly performed tensile strength tests. The inventor prepared three kinds of lead wires having the wire diameter dimensions d of φ0.4, φ0.5, and φ0.6 and set the areas S of the solder land sections in substrates to three patterns of 4 mm$^2$, 6 mm$^2$, and 8 mm$^2$.

The inventor joined, with soldering, the lead wires having the different wire diameter dimensions d to the solder land sections having the different areas S, applied tensile force to the joined lead wires, and measured tensile strength. As a result, measurement results shown in the table below are obtained.

TABLE 1

| Land area S | Wire diameter d (mm) | | | | | Unit: N |
|---|---|---|---|---|---|---|
| (mm$^2$) | φ0.4 | | φ0.5 | | φ0.6 | |
| 8 | 27.0 | Cut | 45.0 | Cut | 43.3 | Come off |
| 6 | 22.5 | Come off | 30.8 | Come off | 18.0 | Peel |
| 4 | 21.5 | Come off | 17.1 | Peel | 13.5 | Peel |

In Table 1, "cut" means that the lead wire is cut by application of tensile force to the lead wire. "Come off" means that the lead wire comes off the solder land section. "Peel" means that the solder peels from the solder land section. In other words, "cut", "come off", and "peel" indicate forms of disconnection of the electrically connected lead wire.

As shown in Table 1, for example, if the lead wire having the wire diameter dimension d of φ0.4 is joined to the solder land section having the area S of 8 mm$^2$, the lead wire is cut at tensile strength of 27.0 (N). If the lead wire is joined to the solder land section having the area S of 4 mm$^2$, the lead wire comes off the solder land section at tensile strength of 21.5 (N).

If the lead wire having the wire diameter dimension d of φ0.5 is joined to the solder land section having the area S of 6 mm$^2$, the lead wire comes off the soldered and joined portion at tensile strength of 30.8 (N). If the lead wire is joined to the solder land section having the area S of 4 mm$^2$, the solder peels from the soldered and joined portion at tensile strength of 17.1 (N).

Further, if the lead wire having the wire diameter dimension d of φ0.6 is joined to the solder land section having the area S of 6 mm$^2$, the solder peels from the solder land section at tensile strength of 18.0 (N). If the lead wire is joined to the solder land section having the area S of 4 mm$^2$, the solder peels from the solder land section at tensile strength of 13.5 (N).

In Table 1, for example, if the lead wire has the wire diameter dimension d of φ0.4 and the area S of the solder land section is 4 mm$^2$, "come off" is written at tensile strength of 21.5 (N). However, in specific test data, "come off" and "cut" are mixed among measurement samples because of various factors such as fluctuation of joined states and "come off" occurs inmost cases. Therefore, the inventor determines that it is appropriate to understand the form of the disconnection as "come off" and writes "come off".

A graph of the tensile strength of the lead wire is shown in FIG. 17 on the basis of the result shown in Table 1. In the figure, the ordinate indicates the tensile strength (N) and the abscissa indicates the wire diameter dimension d (mm) of the lead wire. Concerning the area S (mm$^2$) of the solder land section of (a) 8 mm$^2$, (b) 6 mm$^2$, and (c) 4 mm$^2$, the tensile strengths (N) at which the forms of disconnection of the electrically connected lead wire, i.e., "cut", "come of", and "peel" occur are plotted for each of the wire diameter dimensions d of the lead wire and connected by line segments.

Examination 1

FIG. 17 is examined as explained below. In the form of disconnection of the electrically connected lead wire, the peak value of the tensile strength (N) is present in the lead wire having the wire diameter dimension d of φ0.5 if the area S of the solder land section is (a) 8 mm$^2$ and (b) 6 mm$^2$. In the lead wire having the wire diameter dimension d of φ0.4 and φ0.6 before and after φ0.5, the tensile strength (N) is low. If the area S of the solder land section is (c) 4 mm$^2$, the peak value of the tensile strength (N) is present in the lead wire having the wire diameter dimension d of φ0.4.

Therefore, in the case of the lead wire having the wire diameter dimension d exceeding φ0.6, if the areas S of the solder land sections are applied, it is presumed that "peel" and "come off" occur at lower tensile strength (N) as indicated by an arrow dp on the right side in the figure.

On the other hand, in the case of the lead wire having the wire diameter dimension d smaller than φ0.4, if the areas S of the solder land sections are applied, it is presumed that "cut" and "come off" occur at lower tensile strength (N) as indicated by an arrow dp on the left side in the figure.

As a result of such examination, in order to secure predetermined joining strength of the lead wire, in the relation between the wire diameter dimension d (mm) of the lead wire and the area S (mm$^2$) of the solder land section, a desirable range of the wire diameter dimension d of the lead wire is φ0.4 to φ0.6 and a desirable range of the area S of the solder land section is 4 mm$^2$ to 8 mm$^2$.

Examination 2

As shown in Table 1 and FIG. 17, it is seen that "peel" occurs in a region where the tensile strength (N) is low compared with "cut" and "come off". "Peel" tends to occur if the wire diameter dimension d of the lead wire is relatively large and the area S of the solder land section is relatively small.

Therefore, it is possible to prevent, by causing the wire diameter dimension d of the lead wire to tend be small and causing the area S of the solder land section to tend to be large, "peel" that occurs in the region where the tensile strength (N) is low. It is possible to stably secure the joining strength of the lead wire and secure reliability of joining by preventing "peel" from occurring.

Therefore, the inventor examined, on the basis of the result of the tensile strength test, a general formula for calculating an optimum value for preventing a form in which a "peeling"

phenomenon occurs at low tensile strength. As a result, the inventor was able to deduce S>20×d−6 (Formula 1). In Formula 1, the area of the solder land section is represented as S (mm²) and the wire diameter dimension of the lead wire is represented as d (mm). It is possible to secure reliability of joining of the lead wire by satisfying Formula 1. Therefore, it is possible to easily secure reliability by performing design on the basis of Formula 1.

When Formula 1 is verified, for example, if the wire diameter dimension d of the lead wire is φ0.6 and the area S of the solder land section is 4 mm², a value of the right side is 2040.6−6=6. Therefore, S=4. In this case, Formula 1 is not satisfied. In other words, under this condition, the "peeling" phenomenon occurs.

Similarly, if the wire diameter dimension d of the lead wire is φ0.5 and the area S of the solder land section 4 mm², a value of the right side is 2040.5−6=4. Therefore, S=4. In this case, as in the above case, Formula 1 is not satisfied. Under this condition, the "peeling" phenomenon occurs.

Further, if the wire diameter dimension d of the lead wire is φ0.5 and the area S of the solder land section 6 mm² (in the case of the embodiments), a value of the right side is 2040.5−6=4. Therefore, S=6. In this case, Formula 1 is satisfied. Under this condition, the "peeling" phenomenon does not occur.

In this way, it is possible to prevent the "peeling" phenomenon by performing design for satisfying Formula 1 in the relation between the area S of the solder land section and the wire diameter dimension d of the lead wire. It is possible to secure the joining strength in joining of the lead wire and secure reliability of the joining.

Incidentally, FIG. 18 shows a result obtained by carrying out a thermal shock test and measuring tensile strength after the thermal shock test when the wire diameter dimension d of the lead wire is φ0.5 and the area S of the solder land section is 6 mm². This test is a test for repeatedly placing samples under low temperature and under high temperature for a fixed time and thereafter measuring tensile strength.

In the figure, the ordinate indicates the tensile strength (N) and the abscissa indicates the number of times of repetition (cycle) of thermal shock. In this case, a form of disconnection of the electrically connected lead wire is occurrence of "come off". The tensile strength indicates an average value in the samples.

As it is seen from the figure, a change is hardly seen in the tensile strength from the initial period to 1000 cycles and 1500 cycles. Therefore, it is confirmed that it is less likely that the joined state is deteriorated even under an environment in which temperature repeatedly changes and it is possible to stably keep the joining strength.

In the luminaire configured as explained above, when electric power is supplied to the lighting circuit 4, electricity is supplied from the socket sections 3 and the cap sections 7 to the plurality of substrates 61 via the linear conductor 8. The electric power is supplied to the light-emitting elements 62. The light-emitting elements 62 are turned on. Light emitted from the light-emitting elements 62 is transmitted through the translucent main body 5 and radiated downward. A predetermined range is irradiated.

In this case, connectors or the like for electrically connecting the substrates 61 are not used and the lead wires 8 are used. Therefore, it is possible to prevent the connectors or the like from becoming obstacles to light emitted from the light-emitting elements 62.

Heat is generated during lighting of the light-emitting elements 62. The substrates 61 are heated and cooled when the light-emitting elements 62 are turned on and off. The substrates 61 expand and contract mainly in the longitudinal direction. Further, the substrates 61 sometimes laterally shift from each other because of vibration or the like. At this point, since the substrates 61 are connected by the lead wires 8 in which the convex sections 82 are formed, it is possible to absorb the expansion and contraction and the shift with the lead wires 8. However, it is likely that tensile force is applied to the soldered lead wires 8 and the form of disconnection of the electrically connected lead wires 8 occurs.

However, in this embodiment, the joining strength in the joining of the lead wires 8 is secured according to the relation between the area S of the solder land section 61c and the wire diameter dimension d of the lead wire 8. Therefore, it is possible to maintain the connected state and secure reliability of the joining.

The present invention is not limited to the configurations of the embodiments. Various modifications are possible without departing from the spirit of the invention. The embodiments are presented as examples and are not intended to limit the scope of the invention.

In the embodiments, the lead wire in which the convex sections are formed is explained. However, the lead wire is not limited to this form. For example, the lead wire may be a lead wire formed in a linear shape.

As the direct tube type LED lamp functioning as the luminaire, the direct tube type LED lamp configured based on Japan Electric Lamp Manufactures Association Standard JEL801 is explained. However, the direct tube type LED lamp is not limited to this. Configurations not conforming to this standard are also allowed.

Further, the luminaire can be applied to a lamp, a luminaire used outdoor or indoor, a display device, and the like.

What is claimed is:

1. A light-emitting circuit comprising:
    a plurality of substrates in which wiring pattern layers are formed, the substrates including light-emitting elements connected to and mounted on the wiring pattern layers; and
    a linear conductor having electric conductivity, the linear conductor including linear joining sections at both ends electrically connected to the wiring pattern layers of the substrates and a plurality of convex sections formed to be bent from the substrates toward a height direction in a convex shape in an intermediate section between the joining sections, and the joining sections being respectively joined to the wiring pattern layers among the plurality of substrates adjacent to one another.

2. The circuit according to claim 1, wherein a ratio of a height dimension from a start point of bending to a top of the convex section in a direction opposite to a bending direction of the convex section to a wire diameter dimension of the linear conductor is 2 to 3.

3. The circuit according to claim 1, wherein an expansion and contraction amount of the linear conductor is 1 mm to 2 mm.

4. The circuit according to claim 1, wherein an interior angle having a vertex in the intermediate section is set to be smaller than 180 degrees between the joining sections at both the ends.

5. The circuit according to claim 1, wherein
    solder land sections having an area of 4 mm² to 8 mm² are provided on the wiring pattern layer of the substrate, and
    a wire diameter dimension of the joining sections of the linear conductor is 0.4 mm to 0.6 mm and the joining sections are soldered to the solder land sections.

6. The circuit according to claim 5, wherein, when an area of the solder land sections is represented as S (mm²) and a wire diameter dimension of the joining sections is represented as d (mm), a formula $S>20\times d-6$ is satisfied.

7. A luminaire comprising:
a luminaire main body; and
a light-emitting circuit including:
   a plurality of substrates in which wiring pattern layers are formed, the substrates including light-emitting elements connected to and mounted on the wiring pattern layers; and
   a linear conductor having electric conductivity, the linear conductor including linear joining sections at both ends electrically connected to the wiring pattern layers of the substrates and a plurality of convex sections formed to be bent from the substrates toward a height direction in a convex shape in an intermediate section between the joining sections, and the joining sections being respectively joined to the wiring pattern layers among the plurality of substrates adjacent to one another.

8. A manufacturing method for a light-emitting circuit for joining a conductive linear conductor to a substrate on which light-emitting elements are mounted and solder land sections are formed, the linear conductor including linear joining sections at both ends and a plurality of convex sections formed to be bent from the substrates toward a height direction in a convex shape in an intermediate section between the joining sections, wherein, in a process for joining, with soldering, the joining sections of the linear conductor to the solder land sections of the substrate, a soldering iron heats a vicinity of the solder land section and a side on which the light-emitting elements are mounted, whereby solder joining is performed.

* * * * *